US010947639B2

(12) United States Patent
Kim et al.

(10) Patent No.: US 10,947,639 B2
(45) Date of Patent: Mar. 16, 2021

(54) MOLTEN TARGET SPUTTERING (MTS) DEPOSITION FOR ENHANCED KINETIC ENERGY AND FLUX OF IONIZED ATOMS

(71) Applicant: U.S.A., as represented by the Administrator of the National Aeronautics and Space Administration, Washington, DC (US)

(72) Inventors: Hyun Jung Kim, Poquoson, VA (US); Sang H. Choi, Poquoson, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 0 days.

(21) Appl. No.: 15/463,778

(22) Filed: Mar. 20, 2017

(65) Prior Publication Data

US 2017/0268122 A1    Sep. 21, 2017

Related U.S. Application Data

(60) Provisional application No. 62/310,216, filed on Mar. 18, 2016.

(51) Int. Cl.
   *C23C 14/34*    (2006.01)
   *C30B 23/08*    (2006.01)
   (Continued)

(52) U.S. Cl.
   CPC .............. *C30B 23/08* (2013.01); *C23C 14/06* (2013.01); *C23C 14/3414* (2013.01);
   (Continued)

(58) Field of Classification Search
   CPC .......................... H01J 37/3432; H01J 37/3435
   See application file for complete search history.

(56) References Cited

U.S. PATENT DOCUMENTS

| 4,198,283 A | * | 4/1980 | Class | H01J 37/3408 |
| | | | | 204/192.12 |
| 4,401,539 A | * | 8/1983 | Abe | H01J 37/3408 |
| | | | | 204/192.1 |

(Continued)

OTHER PUBLICATIONS

H. J. Kim, H. B. Bae, Y. Park, K. Lee, and S. H. Choi, "Temperature dependence of crystalline SiGe growth on sapphire (0001) substrates by sputtering", Journal of Crystal Growth, (2012) vol. 353 (1), pp. 124-128.

(Continued)

*Primary Examiner* — Jason Berman
(74) *Attorney, Agent, or Firm* — Jennifer L. Riley; Robin W. Edwards; Helen M. Gaius

(57) ABSTRACT

Various embodiments provide Molten Target Sputtering (MTS) methods and devices. The various embodiments may provide increases in the kinetic energy, increases in the energy latency, and/or increases in the flux density of molecules for better crystal formation at low temperature operation. The various embodiment MTS methods and devices may enable the growth of a single crystal $Si_{1-x}Ge_x$ film on a substrate heated to less than about 500° C. The various embodiment MTS methods and devices may provide increases in the kinetic energy, increases in the energy latency, and/or increases in the flux density of molecules without requiring the addition of extra systems.

22 Claims, 4 Drawing Sheets

(51) Int. Cl.
| | |
|---|---|
| *C23C 14/35* | (2006.01) |
| *H01J 37/32* | (2006.01) |
| *H01J 37/34* | (2006.01) |
| *C30B 29/52* | (2006.01) |
| *H01L 21/02* | (2006.01) |
| *C23C 14/06* | (2006.01) |
| *C30B 23/00* | (2006.01) |
| *C30B 23/06* | (2006.01) |

(52) U.S. Cl.
CPC .......... *C23C 14/3428* (2013.01); *C23C 14/35* (2013.01); *C30B 23/005* (2013.01); *C30B 23/06* (2013.01); *C30B 29/52* (2013.01); *H01J 37/32027* (2013.01); *H01J 37/32082* (2013.01); *H01J 37/32669* (2013.01); *H01J 37/3405* (2013.01); *H01J 37/345* (2013.01); *H01J 37/3414* (2013.01); *H01J 37/3426* (2013.01); *H01J 37/3432* (2013.01); *H01J 37/3435* (2013.01); *H01J 37/3497* (2013.01); *H01L 21/0242* (2013.01); *H01L 21/02532* (2013.01); *H01L 21/02598* (2013.01); *H01L 21/02631* (2013.01)

(56) References Cited

U.S. PATENT DOCUMENTS

| | | | | |
|---|---|---|---|---|
| 4,407,851 | A | * | 10/1983 | Kurosawa ......... H01L 21/76237 |
| | | | | 204/192.23 |
| 5,322,605 | A | * | 6/1994 | Yamanishi .......... C23C 14/0063 |
| | | | | 204/298.07 |
| 5,507,931 | A | * | 4/1996 | Yang .................... C23C 14/0036 |
| | | | | 204/192.12 |
| 5,563,092 | A | * | 10/1996 | Ohmi ................ H01L 21/02381 |
| | | | | 118/723 E |
| 7,906,358 | B2 | | 3/2011 | Park et al. |
| 8,044,294 | B2 | | 10/2011 | Park et al. |
| 8,226,767 | B2 | | 7/2012 | Park et al. |
| 8,257,491 | B2 | | 9/2012 | Park et al. |

OTHER PUBLICATIONS

H. J. Kim, Y. Park, H. B. Bae, and S. H. Choi, "High-Electron-Mobilty SiGe on Sapphire Substrate for Fast Chipsets" Advances in Condensed Matter Physics. (2015), vol. 2015, pp. 1-10.

* cited by examiner

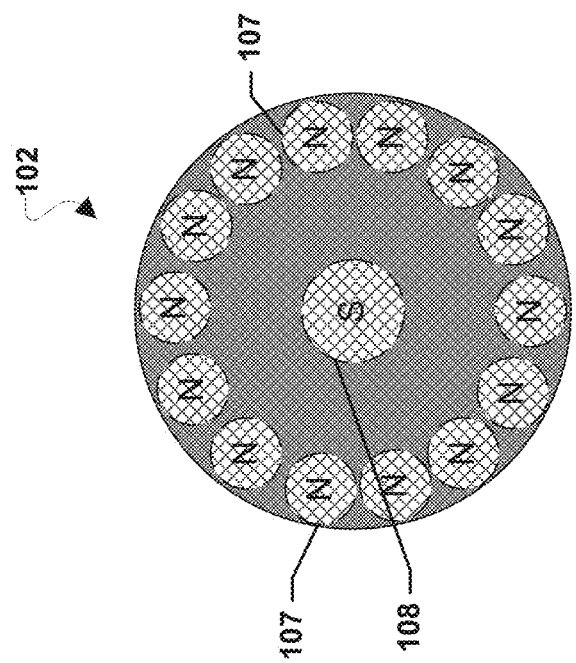
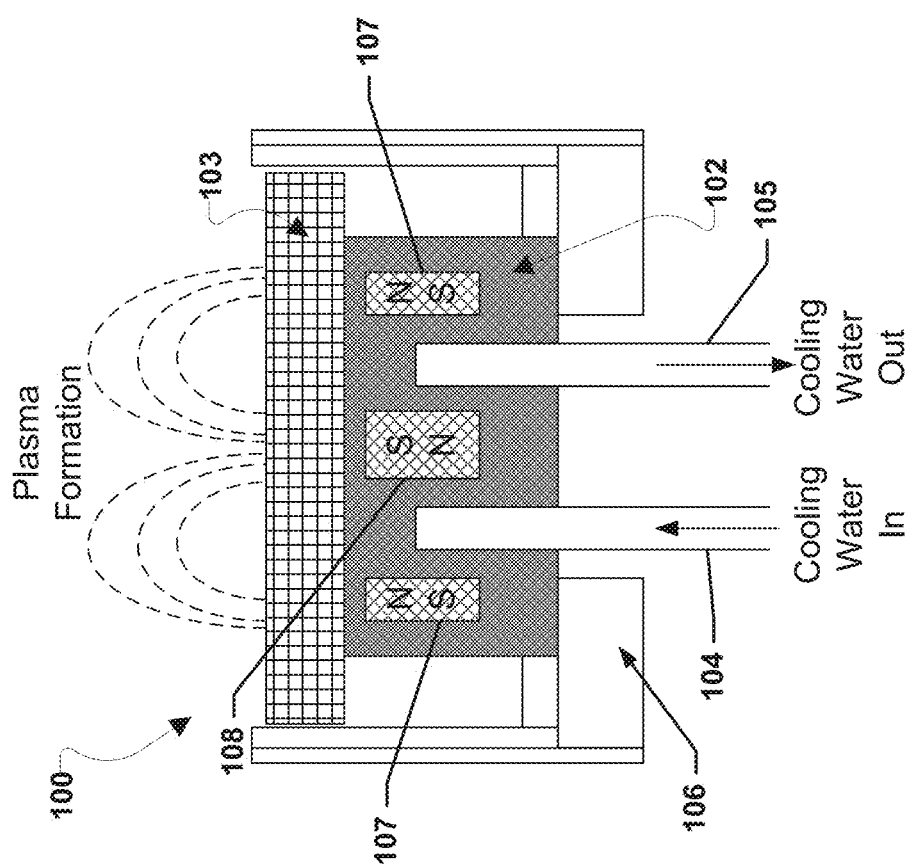

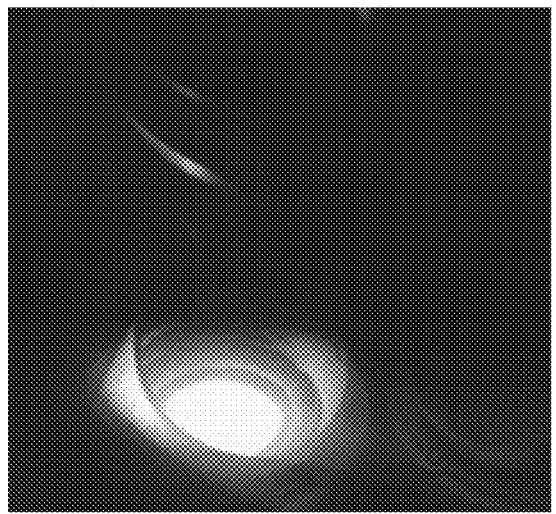
401
402
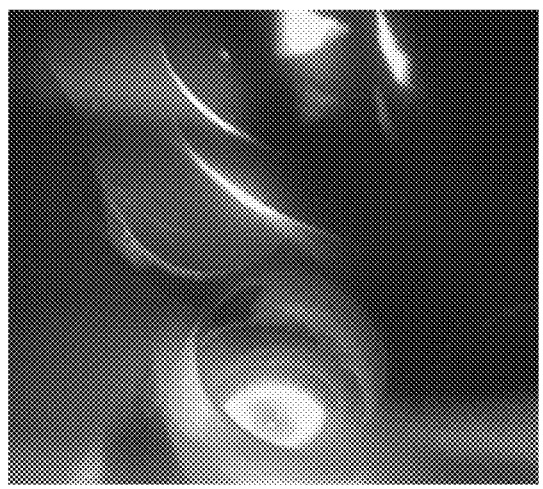
403
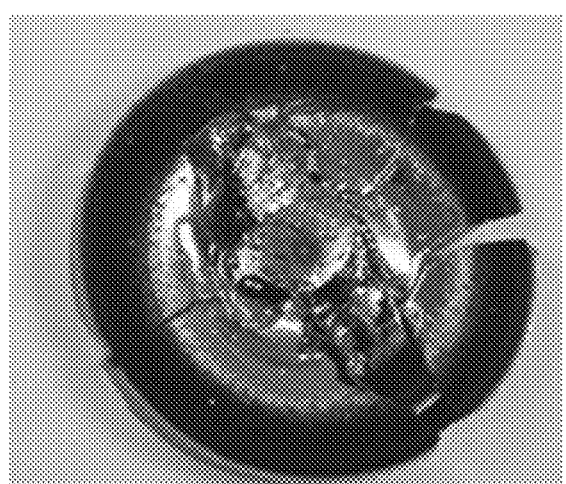
404
FIG. 4

MOLTEN TARGET SPUTTERING (MTS) DEPOSITION FOR ENHANCED KINETIC ENERGY AND FLUX OF IONIZED ATOMS

CROSS-REFERENCE TO RELATED PATENT APPLICATION(S)

This patent application claims the benefit of and priority to U.S. Provisional Patent Application No. 62/310,216, filed on Mar. 18, 2016, the contents of which is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Sputtering has emerged as one of the major deposition techniques for thin film coating practices in both research and industrial production. Many materials have been successfully deposited using the sputtering technique. In the sputtering process, ions are generated from a target material when the ions of glow discharge plasma bombard the target material. One important advantage of sputtering in an epitaxial layer deposition process is that the deposited films keep almost the same composition as the composition of the source material. However, since only surface atoms can be sputtered and freed, the sputtering process is limited by low deposition rates and is also limited by low energy carrying sputtered atoms. The development of high energy carrying sputtered atoms may alleviate or overcome limitations of current sputtering systems.

BRIEF SUMMARY OF THE INVENTION

The present invention provides Molten Target Sputtering (MTS) methods and devices. The various embodiment MTS methods and devices may provide increases in the kinetic energy, increases in the energy latency, and/or increases in the flux density of molecules by combining the benefits of both magnetron sputtering and enhanced evaporation systems. The various embodiments may provide increases in the kinetic energy, increases in the energy latency, and/or increases in the flux density of molecules for better and faster crystal formation on low temperature substrates, such as substrates at or below 500° C. Various embodiments may enable the growth of a single crystal $Si_{1-x}Ge_x$ film on a substrate heated to less than 500° C. Various embodiments may enable the sputtering of atoms onto a substrate such that the atoms have a high flux density (e.g., at or above 2 nanometers (nm) per second (s)(nm/s)) and a high kinetic energy (e.g., at or above 5 electronvolts (eV)). The various embodiment MTS methods and devices may provide increases in the kinetic energy, increases in the energy latency, and/or increases in the flux density of molecules without requiring the addition of extra systems.

In various embodiments of the invention a ring groove may be provided in a surface of a heat sink between magnets of the MTS sputtering gun such that the ring groove may form a gap between the heat sink and a target material during sputtering. In various embodiments, the gap may be about 1 to 2 mm in depth and width. In various embodiments, the ring groove may reduce the dissipation of heat from a target material resulting in the target material's surface transitioning to a liquid phase (i.e., becoming molten) increasing the number of detached atoms from the target material and the energy of those detached atoms.

In various embodiments of the invention trapped magnetic fields, such as magnetic fields trapped by the ring groove, may impart additional kinetic force to atoms and molecules combined with plasma.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

FIG. 1A illustrates a side cutaway view of conventional magnetron sputtering gun;

FIG. 1B illustrates a top view of a heat sink of the conventional magnetron sputtering gun of FIG. 1A;

FIG. 4 shows a comparison between pictures of a conventional magnetron sputtering gun in operation and a resulting trace of a resulting solid target and pictures of an embodiment MTS sputtering gun in operation and a trace of a resulting molten target.

DETAILED DESCRIPTION OF THE INVENTION

Figure 2B:
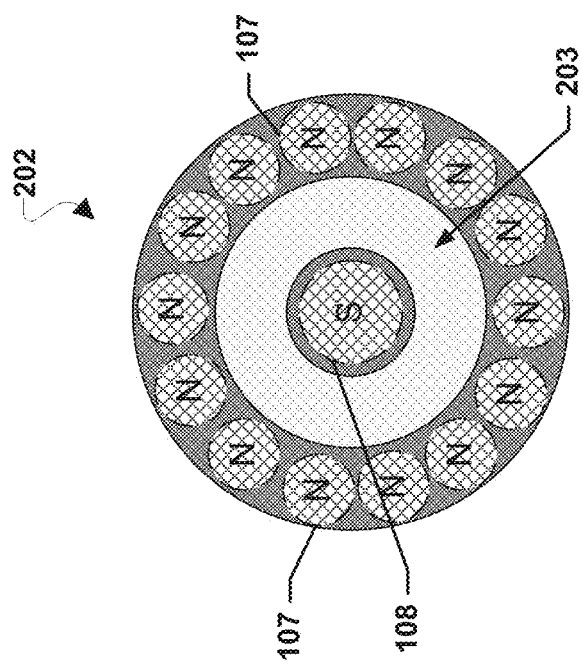
FIG. 2B illustrates a top view of a heat sink of the embodiment MTS sputtering gun of FIG. 2A.

It is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

To configure a rhombohedral structure of crystal, substrate temperature should be maintained close to or above the melting point of an epitaxial component to deliver sufficient energy to the atoms and molecules from sputter target materials while landing on the substrate. Normally zinc-blende or cubic structure of materials may not be structurally settled as a regular formation of crystal on a trigonal structure of sapphire substrate due to the mismatch of lattice constants. In order for zinc-blende or cubic materials to be grown as a single crystal in a form different from their intrinsic structural formation, a sufficient amount of energy must be delivered to the atoms or molecules which will use the added energy to reconfigure the crystallinity based on the trigonal structure of the sapphire substrate at the time, or about the time, the delivered atoms or molecules are landing on the substrate. However, heating the substrate above the melting point of deposited materials may not be easy since the wider the substrate is, the more difficult uniform heating of the substrate may be. Additionally, the processing time to reach a desired equilibrium temperature of the substrate may be very long, such as 2 to 4 hours, which may be an unacceptable timeframe for commercial applications.

Magnetron sputtering is widely used for the growth of epitaxy. Magnetron sputtering is distinguished by a discharge of plasma by direct current (DC) and radio frequency (RF) for the formation of atomic flux from a target material plate. In both cases, a target material plate (cathode) is bombarded by argon ions of a glow discharge plasma. With DC plasma, metallic materials as a target material are more effective. The bombardment by energetic argon ions causes the production of atomic pellets out of the target material's surface. The plume of these atoms out of the target material's surface are merged into and further energized by collisions with argon ions within the argon plasma which is present in front of the target material plate between the target material and the surface to be coated (e.g., a substrate). The magnets which are placed in a vertically-oriented circumferential co-axe formation under the target material plate and plasma create a static and uniform magnetic field where ions and electrons are captured along the flux lines of the magnetic field by Lorentz force, resulting in helical motions from electron and ion cyclotron resonances (ECR and ICR). In a circumferentially uniform field, the motions of ions and electrons are uniform and perpendicular to the field and towards the substrate for condensative dangling of the sputtered target material on a substrate as a thin film. Secondary electrons are also emitted from the target material's surface as a result of the ion bombardment, and these electrons play an important role in maintaining the plasma. Sputtering process as a deposition technique has an advantage that the deposited film has the same composition as the target material. However, the sputtered atoms from a solid target material surface used in conventional sputtering have a very low kinetic energy and a low domain energy thus causing poor energy latency. Thus, conventional sputtering systems generally have low deposition rates.

In evaporation deposition systems, such as E-beam evaporation systems, thermal evaporation systems, etc., a target material in a crucible can be heated and evaporated thermally or by focusing an electron beam at a very high vacuum pressure greater than at least $10^{-7}$ torr. In such a fashion of evaporation processes, highly energized atoms fly over to the substrate for epitaxy formation. Nearly all metal layers in the early semiconductor technologies were deposited by thermal evaporation. Evaporators have the advantages of relatively high deposition rates and thickness control. With multi-loaded evaporator cells in a system, sophisticatedly designed epitaxy is grown for industrial production. Although evaporation process is still used in many research labs, the technique is today replaced by inexpensive and simple sputtering process in most film technologies.

A different way of providing a sufficient amount of energy to the oncoming atoms and molecules may be more beneficial for the sputtering process. In other words, since the imbedded energy of atoms and molecules would determine the kinetic energy and elevate the energy latency for the degrees of freedom to readily reconfigure when they arrive at a substrate, it would be beneficial for these atoms and molecules within a diffusion plasma to be preloaded with sufficient energy during the sputtering process and prior to landing on the substrate.

FIG. 1A illustrates a side cutaway view of conventional magnetron sputtering gun 100. The magnetron sputtering gun 100 is configured to sputter plasma on a solid target. The magnetron sputtering gun 100 includes a heat sink 102, such as a copper heat sink, supported by a retainer ring 106. Cooling water is feed into the heat sink 102 by a cooling water inlet 104 and the cooling water exits the heat sink 102 via the cooling water outlet 105. The heat sink 102 is tubular. Within the heat sink 102, a ring of magnets 107, where the ring is formed by a plurality of magnets 107, is arranged around an outer edge of the heat sink 102, and a center magnet 108 is positioned at the center of the heat sink 102 within the ring of magnets 107. The magnets 107 and the center magnet 108 may be encased, partially or completely, within the heat sink 102. FIG. 1B illustrates a top view of the heat sink 102 of the conventional magnetron sputtering gun 100 showing the relative orientation of the magnets 107 outboard of, and encircling, the center magnet 108. The magnets 107 may be oriented such that the poles of the magnets 107 are inverted relative to the poles of the center magnet 108. For example, the north poles of the magnets 107 and the south pole of the center magnet 108 may be oriented toward a top surface of the heat sink 102, and the north pole of the center magnet 108 and the south poles of the magnets 107 may be oriented toward the bottom of the heat sink 102. A solid target material 103 for sputtering onto a surface (e.g., a substrate) may be supported in the retainer ring 106 adjacent to the heat sink 102.

In operation, the conventional magnetron sputtering gun 100 provides direct discharge plasma by DC or RF discharge plasma for the formation of atomic flux from the target material 103. The target material 103 in the retainer ring 106 may be powered to act as a cathode plate and may be bombarded by ions of a gas, such as argon ions, of a glow discharge plasma. The bombardment by energetic ion, such as argon ions, causes the production of atomic pellets out of the surface of the target material 103. The plume of these atoms out of the target material 103 are merged into and further energized by collision with the ions, such as argon ions, within the plasma (e.g., argon plasma) which is stationary in front of the target material 103 between the solid surface of the target material 103 and the surface (e.g., a substrate) on which the target material 103 is to be deposited. The magnets 107 and 108 which are placed as a vertically-oriented circumferential co-axe formation under the target material 103 plasma create a static and uniform magnetic field where ions and electrons are captured along the flux lines of the magnetic field by Lorentz force, resulting in helical motions from ECR and ICR. In the circumferentially uniform field, the motions of ions and electrons are uniform and perpendicular to the field and towards the surface (e.g., a substrate) on which the target material 103 is to be deposited as a thin film for condensative dangling on that surface. Secondary electrons are also emitted from the target materials 103 surface as a result of the ion bombardment, and these electrons play an important role in maintaining the plasma. In this manner, the magnetron sputtering gun 100 enables the target material 103 to be sputtered onto a target surface (e.g., a substrate). The magnets 107 and the center magnet 108 are arranged in the heat sink 102 in such a way that when the target material is placed in the retainer ring 106, one pole of the center magnet 108 is positioned at the central axis of the target material 103 and the opposite poles of the ring of magnets 107 are circumferentially placed around the outer edge of the target material 103 to confine the electrons along the magnetic flux lines near the target material to increase the deposition rate of the target material 103 on a surface (e.g., a substrate).

The atoms operating as pellets out of the surface of sputtering target material 103 in the conventional magnetron sputtering gun 100 are generally few due to the collision of the sputtering target material with low temperature plasma of argon. In current sputtering systems, argon is used as a processing gas due to argon's inert property and the large cross-section of argon for collision. Argon can be easily dissociated and become a plasma under even low voltage stress. That is, argon can become a low temperature plasma. Accordingly, the delivery of energy through collision between the pellet atoms and ionized argon is also regarded as a low level energy delivery which is not enough for the formation of a rhombohedral structure of epitaxial atoms.

Some current sputtering systems may provide better conditions for epitaxy, such as High Power Impulse Magnetron Sputtering (HIPIMS) or Ion Beam Assisted Deposition (IBAD). HIPIMS utilizes extremely high power in pulse mode with tens of micro-seconds pulse-width. Therefore, HIPIMS obtains a high degree of ionization of the processing gas that drastically increases the kinetic energy and latency of the sputtered atoms, resulting in high deposition rate and quality enhancement. The ionization rate of sputtered atoms depends on the charge transfer through high collision frequency within high density plasma. The HIPIMS is also used for cleaning and adhesion enhancing pretreatment of the substrate prior to the epitaxial process. However, the HIPIMS imposes a risk for overheating the target and other system components. In IBAD, a thin film is grown by combining ion implantation with simultaneous sputtering. In other words, the combination of a sputter or e-beam evaporator and ion beam gun for implantation concurrently operates to create a thin-film. By planting ions into the substrate, there is a reliable and durable bonding between the host epitaxy and substrate with less built-in strain. The IBAD process also permits control over film properties such as morphology, density, stress level, and crystallinity. However, the ion source used for the operation needs to have specific design and performance qualities in order to obtain optimum process results. Especially, the ion source must be physically compact enough to permit unobtrusive installation into the thin film deposition system without interference to other process accessories, mechanically, electrically, or magnetically. Additionally, the ion source also needs to have a beam of sufficient diameter to adequately cover the required area at the substrate.

These current sputtering systems need specific design parameters to be tailored by the addition of extra systems, such as special power units to enhance the plasma temperature based on targets for sputtering or beam sources. For example, HIPIMS utilizes extremely high power densities of the order of kW/cm$^2$ in a pulse mode operation. A pulse-width of tens of microseconds with low repetition rate by on/off time ratio is typical in HIPIMS. Due to the high power in a pulse mode, a high degree of ionization of the sputtered metal is expected. Most current sputtering systems are pre-configured for a certain plasma temperature and density in operation. Most sputtering methods are limited in controlling the kinetic energy and flux density of atoms which are directly related to the film quality and deposition rate. High crystallinity (including hetero-epitaxial single crystal without twin and dislocation) and smooth topological formation in epitaxy are very difficult to achieve with the conventional sputtering processes due to the low kinetic energy, the low energy latency, and the low flux density. Additionally, thick film (>100 µm) deposition not readily achievable with conventional sputtering processes due to the low flux density. Any variability in operation of these current sputtering systems to increase the kinetic energy and the flux density of molecules may determined by their subsystems, like power supply and high voltage holdoff design of the sputter gun. Accordingly, any sputtering operation for the enhanced film quality and deposition rate is not readily available in current sputtering systems without the addition of extra systems. Thus, no current sputtering system could increase the kinetic energy and flux density of molecules without the provisioning of extra-attached systems.

Various embodiments provide Molten Target Sputtering (MTS) methods and devices. The various embodiment MTS methods and devices may provide increases in the kinetic energy, increases in the energy latency, and/or increases in the flux density of molecules by combining the benefits of both magnetron sputtering and evaporation systems. The various embodiments may provide increases in the kinetic energy, increases in the energy latency, and/or increases in the flux density of molecules for better crystal formation at low temperature operation. The various embodiment MTS methods and devices may provide increases in the kinetic energy, increases in the energy latency, and/or increases in the flux density of molecules without requiring the addition of extra systems. The various embodiment MTS methods and devices may enable the sputtering of atoms onto a substrate such that the atoms have a high flux density (e.g., at or above about 2 nanometers (nm) per second (s)(nm/s)) and a high kinetic energy (e.g., at or above about 5 electronvolts (eV)).

The various embodiment MTS methods and devices that may enable the growth of high-quality thin (i.e., less than about 100 nanometers (nm)) and thick (i.e., greater than about 100 micrometers (µm)) films with the molten target material and plasma. The degree of precise formation of rhombohedral structure at sapphire substrate may be greatly improved for both high quality of crystal and high yield by the various embodiment MTS methods and devices. In conventional sputtering techniques, the pre-processor is required to elevate the sapphire wafer temperature to provide a sufficient energy to a level for the modification of crystal structure formation of impinging atoms through a long thermal soak process (e.g., about 2-4 hours of thermal heating). A long operation at high temperature of the pre-processor in conventional sputtering techniques is costly and burdensome for timely process. In order to alleviate such a long operation of a pre-processor at high temperature, the various embodiment MTS methods and devices may provide the high quality and the highest deposition rate of epitaxy from the benefits of molten target materials and trapped fields by the provisioning of a built-in ring groove. The film from the high kinetic energy molecules improves the crystal quality, coating density, electrical property, and surface uniformity. The various embodiment MTS methods and devices may provide a very-high-rate deposition of thick (e.g., greater than about 100 µm) film, dense microstructures, smooth surface (e.g., rms less than about 1 nm), enhanced resistance to cracking, good control of film composition, high quality film (including epitaxy film), coating for the inner surface of complex geometries, improved coating uniformity, and/or low temperature deposition processes resulting in superior film quality.

Various embodiments may provide a MTS sputtering gun 200 as illustrated in FIG. 2. The embodiment MTS sputtering gun 200 may be similar to, and operate in a similar manner to, the conventional sputtering gun 100 described above with reference to FIGS. 1A and 1B, but the embodiment MTS sputtering gun 200 may include a ring groove 203 disposed between the ring of magnets 107 and the center magnet 108. The heat sink 202, such as a copper heat sink, may be similar to the heat sink 102 described above with reference to FIGS. 1A and 1B, except that the heat sink 202 may be configured such that the heat sink 202 includes the ring groove 203 on the surface that will be pointed toward (or contact) the target material 103 during operation of the MTS sputtering gun 200. The ring groove 203 may be disposed between portions of the magnets 107 and the center magnet 108 such that the ring groove 203 separates a portion of one or more of the magnets 107 from a portion of the center magnet 108. For example, the ring groove 203 may be a groove encircling the center magnet 108 between the ring of magnets 107 and the center magnet 108 on a top surface of the heat sink 202 as shown in FIG. 2B. The ring groove 203 may provide for partial heating of the target material 103 and may provide for enhanced plasma formation.

Figure 2A:
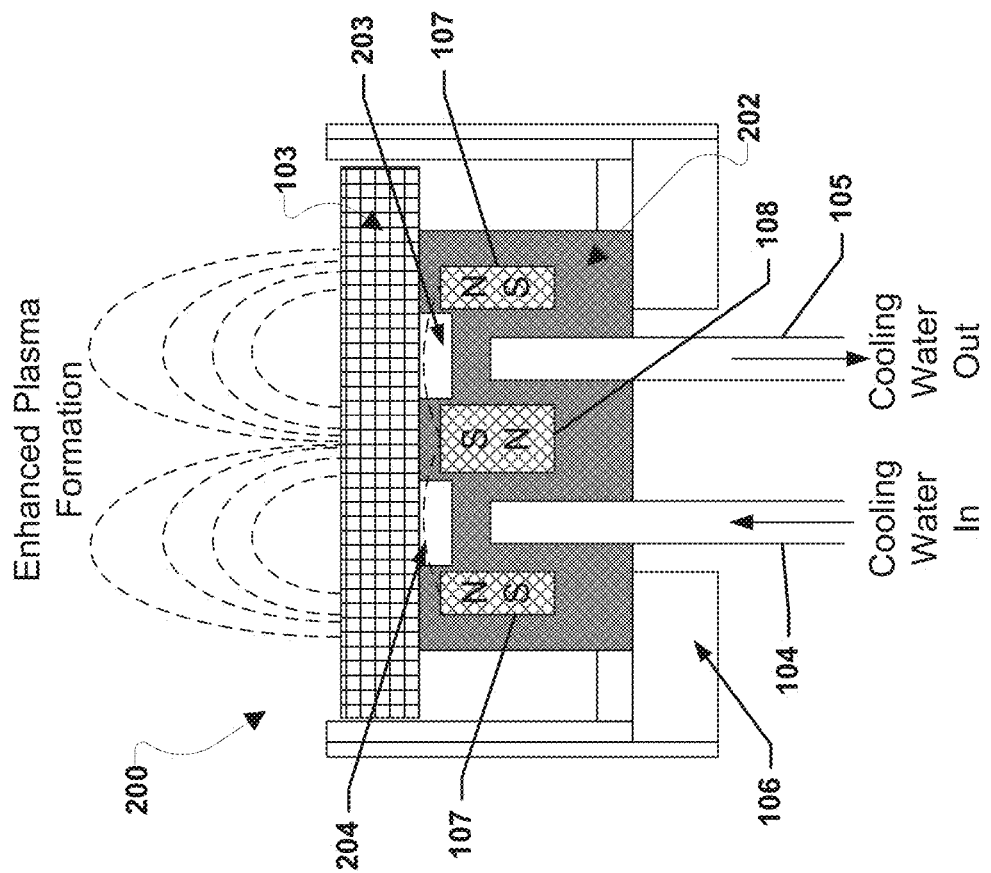
FIG. 2A illustrates a side cutaway view of an embodiment Molten Target Sputtering (MTS) sputtering gun.

In the various embodiments of MTS methods and devices, a ring shaped groove 203 may be cut between the magnets 107 and the center magnet 108. In various embodiment MTS methods and devices, only about a 1 to 2 mm (depth and width) ring shape groove 203 may be cut between the magnets 107 and the center magnet 108 in order to keep a gap between the heat sink 202, such as a copper plate, and the target material 103, as shown in FIG. 2A. In other embodiments, the ring groove 203 may have larger or smaller depths and/or widths than about 1 to 2 mm and the depth and width may or may not be different from one another. The width of the ring groove may be the distance separating the two side walls of the ring groove 203 and the depth may be the height of those side walls. The target material 103 may be any thickness. A target material 103 thickness of about ⅛ of an inch or less may reduce the thermal mass of the target material 103 such that the target material 103 surface is melted to, and keeps a, molten state with less power input than with target material 103 thicknesses above about ⅛ of an inch.

A key difference in design between a conventional sputtering gun, such as sputtering gun 100 described with reference to FIGS. 1A and 1B, and an embodiment MTS sputter gun, such as MTS sputtering gun 200 described with reference to FIGS. 2A and 2B, may be the ring shaped groove 203 between the magnets 107 and the center magnet 108 to allow for the trapping of a portion of the magnetic field 204 within the ring-shaped groove 203. A trapped field 204 may have an additive force to push out the ionized particles (atoms and molecules combined within plasma) further away from the target material 103, thereby gaining a kinetic energy in the embodiment MTS sputtering gun 200 that is not achieved by a conventional sputtering gun. The top surface of target material 103 situated above the ring groove 203 may become molten by both plasma contact and poor thermal conduction due to the ring groove space 203. The trapped field 204 within the ring groove 203 may also boost the spread of plasma that broadly reaches a substrate on which the target material 103 is to be deposited with high kinetic energy.

Another aspect of the embodiment MTS methods and devices may be to increase the temperature of target material because the conduction passage of thermal energy to the heat sink 202, such as a water cooled copper heat sink, is cut off by an empty space of the ring groove 203 cut out below the target material 103. The empty space may be formed when the heat sink 202 is abutted to the target material 103 when the target material 103 is placed in the retainer ring 106 which may be configured to support the heat sink 202 and the target material 103. The empty space made by the target material 103 and the ring groove 203 on the heat sink 202, such as a copper plate, may not allow thermal conduction from a heated target material. Due to the ring groove 203 in the heat sink 202 that hinders heat dissipation from the target material 103, the heat built on the surface of the target material 103 where plasma is directly touched makes the target surface 103 to be partially melted. In the embodiment MTS sputtering gun 200, the glow discharge plasma stands up to the molten target material stably with the assist of the circumferential magnetic field provided by the imbedded magnets 107 and center magnet 108 inside the heat-sink 200. The sputtered atoms coming out of this molten surface of the target material 103 contain much more energy than those released from a surface of a target material that remains solid during sputtering, such as the surface of target material 103 in the sputtering gun 100 described above with reference to FIGS. 1A and 1B.

The surface of the target material 103 may be heated up more and melt out without heat dissipation through a conduction path in an embodiment MTS sputter gun or method, such as MTS sputtering gun 200 described with reference to FIGS. 2A and 2B, because of the ring groove space 203. This heating up and melting out of the surface of the target material 103 by the embodiment MTS sputter guns is in contrast to the target material 103 in a conventional sputtering gun or method, such as sputtering gun 100 described with reference to FIGS. 1A and 1B, in which the target material does not melt (i.e., does not reach a liquid state) and remains a solid target material 103 during sputtering.

By raising the temperature of target materials, such as the target material 103, a larger number of detached atoms and molecules from the target material 103 may be easily yielded and the detached particles may also have originally gained high energy from the molten target materials in an embodiment MTS sputter gun or method than in a conventional sputtering gun or method. As compared to the sputtering gun 100, the molten target material 103 is generated by the MTS sputtering gun 200 releases a greater number of high latency atoms that carry sufficient energy towards a substrate on which the target material 103 is to be deposited, thereby better facilitating the formation of modified crystal structure from cubic to rhombohedral crystal.

Additionally, the MTS sputtering gun 200 may achieve the increases in the kinetic energy, increases in the energy latency, and/or increases in the flux density of molecules without a risk of overheating the target material 103 or other system components as no additional energy than that which is provided in conventional magnetron sputtering guns may be provided to the MTS sputtering gun 200. Additionally, no extra systems or components, such as e-beams, ion beam guns, high power pulse modes, extra power units to heat the plasma, etc., need to be added to the MTS sputtering gun 200. The addition of the ring groove 203 enables the increases in the kinetic energy, increases in the energy latency, and/or increases in the flux density of molecules without the addition of extra systems or components, such as e-beams, ion beam guns, high power pulse modes, extra power units to heat the plasma, etc. Thus, the MTS sputtering gun 200 may enable the growth of single crystal SiGe epitaxy on sapphire without the addition of extra systems or components, such as e-beams, ion beam guns, high power pulse modes, extra power units to heat the plasma, etc., and/or without heating the substrate on which a target material is to be deposited to at or above about 500° C.

Figure 3:
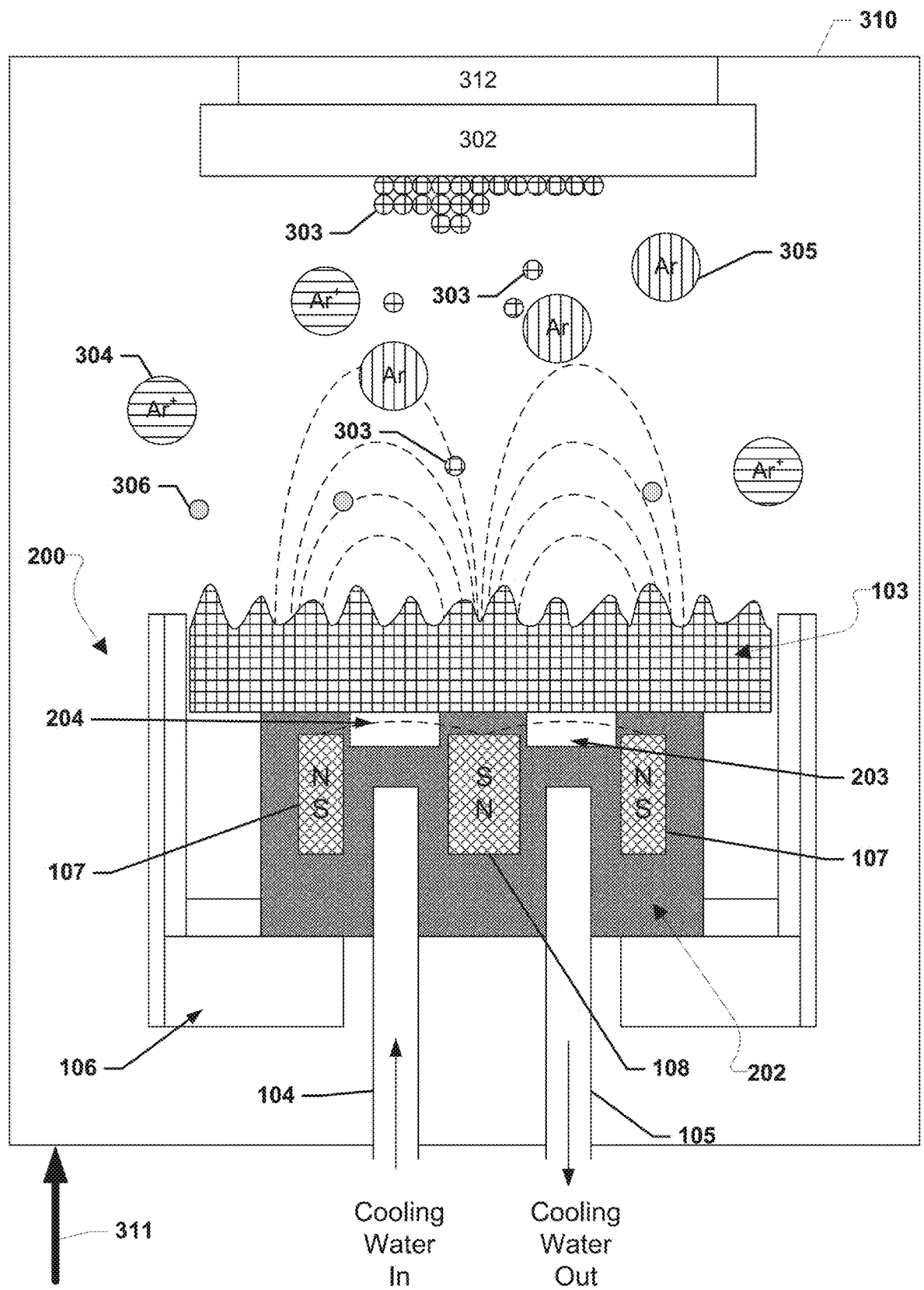
FIG. 3 illustrates an embodiment MTS deposition method.

FIG. 3 illustrates an embodiment MTS deposition method in which embodiment MTS sputtering gun 200 is used in a MTS system to deposit released atoms 303 of the target material 103 on a substrate 302. The MTS system may include the MTS sputtering gun 200, a vacuum chamber 310, a power supply, a gas supply 311 (such as an argon (Ar) supply or argon (AR) and nitrogen (N) supply), a heat source configured to heat a substrate, and a substrate support 312 configured to hold the substrate 302. In the MTS system, the argon (Ar) atoms 305 bombard the heated and molten surface of the target material 103 which eventually causes atoms 303 of the target material 103 to be kicked out of the molten surface of the target material 103. The released atoms 303 pile up on the substrate 302 to form a film on the substrate 302.

In operation, argon (Ar) gas may be introduced into the vacuum chamber 310 surrounding the MTS sputtering gun 200 and substrate 302 from the gas supply 311. While the various embodiments are discussed herein with reference to argon (Ar) gas introduced into the vacuum chamber 310, argon (Ar) gas is used merely as an example, and other gas mixtures may be substituted for argon (Ar) in the various embodiments. For example, a gas formed from a mixture of nitrogen (N) and argon (Ar) may be supplied to the vacuum chamber 310 from the gas supply 311, and the nitrogen (N) and argon (Ar) gas mixture may be substituted for the argon (Ar) gas in the various embodiments discussed herein. The vacuum chamber 310 may be evacuated to drop the pressure to about the 1 to 10 mTorr level. The substrate 302 may be supported within the vacuum chamber 310 by the substrate support 312. The substrate 302 may be heated to a designated temperature, such as by the heat source. The heat source may be included in the substrate support 312 or may be a separate component within or exterior to the vacuum chamber 310. For example, the substrate 302 may be heated to at or about 500° C. or less than 500° C. The heating of the substrate to at or about 500° C. or less than 500° C. may not require a long operation of a pre-processor, thereby reducing the heating time of the substrate 302 to below 2 hours.

Power may be applied to the target material 103 from the power source such that the target material 103 operates as a cathode. By a DC discharge or RF discharge process a plasma volume under a glow discharge may be formed in a space between the target materials 103 and the substrate 302. In a DC discharge process, electrons 306 may move to the anode and ions to the cathode. Argon (Ar) atoms 305 may be ionized by the collision with the electrons 306 and ions to from argon (Ar$^+$) ions 304.

High frequency collisional contacts by the argon (Ar$^+$) ions 304 in the plasma volume onto the surface of the target material 103 heat up the surface of the target material 103. Additionally, the ring groove space 203 may cause increased heating of the target material 103 due to poor thermal conduction at the top portion of the heat sink 202 thereby heating the target material 103. Through the heating from the collisions and poor thermal conduction caused by the ring groove 203, the surface of the target material 103 may be changed into a liquid phase (i.e., the surface of the target material 103 may be melted). Atoms 303 of the target material may be sputtered out with high gain of latency from the liquid phased (or molten) target material 103. Additionally, the ring-shaped groove 203 between the magnets 107 and the center magnet 108 may trap a portion of magnetic field 204 within the ring-shaped groove 203. The trapped field 204 may have an additive force to push out the ionized particles further away from the target material 103, thereby gaining a kinetic energy in the embodiment MTS sputtering gun 200 that is not achieved by a conventional sputtering gun. The trapped field 204 within the ring groove 203 may also boost the spread of plasma that broadly reaches the substrate 302 on which the target material 103 is to be deposited with high kinetic energy. The target material 103 in liquid phase may be gradually eroded by the high frequency bombardment of ions. The sputtered atoms 303 of the target material may be accelerated to the anode substrate 302.

The sputtered target material atoms 303 arrive at the substrate 302 and may develop a crystalline structure on the substrate 302 as a thin film. The embodiment MTS sputtering gun 200 causes more and more atoms to become coalesced on the substrate 302 with higher kinetic energy and higher flux density than in the conventional sputtering processes, and the atoms 302 begin to bind to each other at the molecular level, forming a tightly bound atomic layer. For example, the atoms may have a high flux density, such as a flux density at or above about 2 nm/s (e.g., flux density of about 2 nm/s, about 2-3 nm/s, about 3 nm/s, about 3-4 nm/s, about 4 nm/s, about 4-5 nm/s, greater than about 5 nm/s, etc.), and/or a high kinetic energy, such as a kinetic energy at or above about 5 eV (e.g., kinetic energy of 5 eV, 5-6 eV, 6 eV, 6-7 eV, 7 eV, 7-8 eV, 8 eV, greater than 8 eV, etc.). The atom pellets 302 puffed out of the molten surface of the target material 302 have high energy latency (or energized) because the target material 103 is already molten at an elevated temperature. The high energy latency of sputtered atoms 303 provided by the embodiment MTS sputtering gun 200 helps the formation of modified crystalline structure from a typical cubic or zinc-blende structure. Since the change in crystalline structure requires a substantial energy, most conventional practices in epitaxy growth have used an excessively heated substrate to deliver the necessary energy to impinging sputtered atoms. In contrast, the embodiment MTS sputtering gun 200 may enable epitaxy growth without excessive heating of the substrate 302. For example, the embodiment MTS sputtering gun 200 may enable epitaxy growth on a substrate at or below 500° C.

The flux of these sputtered atoms 303 with high latency is very important to grow a modified crystalline structure away from a typical formation of cubic or zinc-blende structure. A typical formation of cubic or zinc-blende materials on a selected substrate often creates lattice mismatch caused defects. This lattice mismatch issue can be alleviated by the embodiment MTS sputtering gun 200 by the high latency of the sputtered atoms 303. For example, FIG. 4 shows a comparison between a conventional magnetron sputtering gun in operation in picture 401 and the resulting wear trace of the solid surface of the target material in picture 402 and a molten target surface that is smooth and uneven as shown in picture 404 that was formed by the operation of a magnetron-sputtering gun using MTS deposition according to an embodiment as shown in picture 403.

Although the differences in design between the conventional sputtering guns, such as sputtering gun 100 described above with reference to FIGS. 1A and 1B, and embodiment MTS sputtering guns, such as MTS sputtering gun 200 described above with reference to FIGS. 2A, 2B, and 3, may appear to be only slight with the addition of the ring groove, such as ring groove 203, in the embodiment MTS sputtering guns, the performance of the embodiment MTS sputtering guns may be greatly different than that of conventional sputtering guns.

For the growth of single crystal SiGe epitaxial layer by conventional sputtering guns, the substrate must be uniformly heated close to about 1000° C. in order to deliver a sufficient energy to the impinging sputtered Si and Ge atoms. At this excessive temperature (i.e., close to about 1000° C.), the Si and Ge atoms gain energy from highly heated substrate to relax and realign a crystal structure of SiGe to fit onto the trigonal crystal structure of sapphire. A final structural form of SiGe becomes rhombohedral to equally and stably tying up with the lattice constant of sapphire. However, such a high temperature requirement (i.e., close to about 1000° C.) for growing high quality single crystal SiGe epitaxy on sapphire wafer is difficult to achieve, cumbersome because the heating takes a long time to reach the high temperature (i.e., close to about 1000° C.), and costly in time and energy resource. The use of the various embodiment MTS sputtering guns and methods for SiGe epitaxy alleviates the strict requirement of high substrate temperature (i.e., close to about 1000° C.). The growth results of SiGe epitaxy on sapphire using an MTS sputtering gun according to the various embodiments was tested in experiments and assured about 99.99% single crystal growth at or about 500° C. substrate temperature. This lowered substrate temperature (i.e., at or about 500° C. or less than 500° C.) may be easier to achieve, less cumbersome because the lowered substrate temperature (i.e., at or about 500° C. or less than 500° C.) may be reached faster, and may be less costly in time and energy inputs, when compared to conventional sputtering guns. The lowered substrate temperature (i.e., at or about 500° C. or less than 500° C.) may be compensated for by the flux of high latency sputtered atoms achieved by the various embodiments while growing a relaxed SiGe crystal structure of rhombohedron.

The embodiment MTS sputtering guns may generate more atoms with high energy latency than the solid target sputtering of conventional sputtering guns. The trapped field of the embodiment MTS sputtering guns within ring groove may have an additive role for pushing and spread the sputtered atoms towards the substrate with high kinetic energy of atoms. The embodiment MTS sputtering guns may provide a high sputtering rate to high epitaxy rate. Embodiment MTS sputtering guns may improve the quality of film by providing a number of atoms with high energy latency during deposition.

The systems using the embodiment MTS sputtering guns may achieve high kinetic energy and high flux density (i.e., high growth rate) of ionized molecules. Such systems using the embodiment MTS sputtering guns may sputter atoms onto a substrate such that the atoms have a high flux density (e.g., at or above about 2 nm/s) and a high kinetic energy (e.g., at or above about 5 eV). The deposition rate from a solid target material surface in conventional sputtering systems is controlled by sputtering process. However, the deposition rate by systems using the embodiment MTS sputtering guns may be mainly dependent on the evaporation process of the molten target material. The evaporation process may be the key aspect as to why the deposition rate and quality of the film may be respectively higher and better in systems using the embodiment MTS sputtering guns than those of conventional sputtering systems using solid target material sputtering. The highest deposition rate may be achieved by systems using the embodiment MTS sputtering guns more effectively in the evaporation process from the molten target because a good number of atoms are easily released from a molten target, which may already be slightly below the marginal point of vapor pressure at an elevated temperature.

When argon ions in plasma bombard the target surface, the energy carried by argon ions is used for: (1) tossing out the atoms of target surface by inelastic collision; and (2) increasing the target temperature by inelastic collision. In the conventional sputtering systems, the target material is actively cooled to maintain the flux of freed atoms. For systems using the embodiment MTS sputtering guns, the target material may be placed on a heat sink, such as a copper heat sink, with a ring groove that creates a non-contacting space to drastically reduce heat dissipation from the target material to heat sink when compared to conventional systems that do not include a ring groove. The target surface which is exposed to plasma is heated up and eventually melted in systems using the embodiment MTS sputtering guns. The release of atoms from the molten surface of target material requires much lower energy in systems using the embodiment MTS sputtering guns than in conventional systems. Therefore, the rest of energy of the argon ions that is passed to the atoms at the molten surface through collision may be mainly used for raising the kinetic energy of freed atoms in systems using the embodiment MTS sputtering guns.

The atoms freed from the molten surface of the target material have much higher energy in their atomic embodiment in systems using the embodiment MTS sputtering guns as compared to those using the conventional solid sputtering process. The systems using the embodiment MTS sputtering guns run the target material at a high temperature as compared to the conventional solid target sputtering processes which run the target material at a low temperature. Therefore, the atoms freed from the molten target material surface have much more radically with high activation energy (namely, high energy latency) in systems using the embodiment MTS sputtering guns than in conventional systems. When these atoms arrive on the surface of substrate, these atoms may get together to form a modified lattice structure according to the crystalline structure of the substrate away from their typicality in systems using the embodiment MTS sputtering guns. This process may be critical for joining two different crystalline structures together. Away from the typicality of intrinsic crystal form, orderly arrangement of incoming atoms into a crystalline structure by tying each one of atoms up to the lattice structure of substrate requires substantial energy for reshaping the crystal lattices. The atoms which carry already the radically with high activation energy can share and provide the energy required for crystal reformation, such as the transition from cubic or zinc-blende to rhombohedral shape. Because the individual molecules carry sufficient energy to modify the crystalline structure in a formation process of crystal on a substrate, in systems using the embodiment MTS sputtering guns the high substrate temperature required by conventional systems is not necessary. In conventional systems, the high temperature, such as about 890° C. or above, is essential for growing the single crystal $Si_{1-x}Ge_x$ on sapphire substrate to modify the shape of cubic or zinc-blende structure into rhombohedron. In contrast, in systems using the embodiment MTS sputtering guns, a substrate heated to less than about 500° C. may be enough to grow the single crystal $Si_{1-x}Ge_x$ film. This substrate temperature of less than about 500° C. may be possible because of the high kinetic energy of atoms, high energy latency of freed atoms, and high flux density of atoms in systems using the embodiment MTS sputtering guns.

The high flux stream of atoms and molecules provided by the various embodiment MTS methods and devices may be ideal for epitaxy applications in roll-to-roll systems (e.g., roll-to-roll gravure systems) and for flexible films which must be run under temperatures below 500° C. Transparent conductive oxide films with high transmittance (e.g., in the IR and visible region) wide band-gap, and low resistivity may be achieved by increasing the density of the films using the various embodiment MTS methods and devices. More-over, the various embodiment MTS methods and devices may be applied for the deposition of desired material on tool or machine surfaces, such as to provide water proofing and/or wear resistance. The various embodiment MTS methods and devices as a pre-processor in semiconductor wafer production routine is most promising for the wafer epitaxy of $Si_{1-x}Ge_x$ single crystal growth by increasing the yield. The various embodiment MTS methods and devices may provide new epitaxial single crystal thin or thick film growth for next generation semiconductor devices. Additionally, the various embodiments may be suitable for use in various applications, including thin and thick film epitaxy processes, very-high-rate deposition of extremely thick (> about 100 μm) film, the production of MEMS devices, semiconductor wafer production, solar cell production, and thin-film coating application.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A sputtering gun, comprising:
a heat sink having magnets encased at least partially by a surface of the heat sink, wherein the heat sink is configured to form a ring groove on the surface of the heat sink encasing the magnets;
a retainer ring configured to support the heat sink and a target material for sputtering on a substrate such that:
the target material contacts the surface of the heatsink thereby forming an empty space between the ring groove on the surface of the heat sink and the target material; and
both the magnets and the ring groove on the surface of the heat sink are under the target material;
wherein the ring groove abuts the target material such that the empty space is in direct communication with the target material, the empty space being configured to be unfilled;
wherein the ring groove is configured to reduce heat flow and retain thermal energy to at least partially melt a surface of the target material opposite a surface of the target material contacted by the surface of the heat sink; and
wherein the sputtering gun is configured such that, during operation of the sputtering gun, atoms of the target material from the at least partially melted surface are ejected toward the substrate for condensative dangling of the target material on the substrate.

2. The sputtering gun of claim 1, wherein:
the magnets comprise a ring of magnets and a center magnet positioned within the ring of magnets;
the ring groove is formed in the surface of the heat sink between the ring of magnets and the center magnet.

3. The sputtering gun of claim 2, wherein the heat sink is a tubular water cooled copper heat sink.

4. The sputtering gun of claim 1, wherein a depth and a width of the ring groove are both a same value from about 1 mm to about 2 mm.

5. A Molten Target Sputtering (MTS) system, comprising:
a vacuum chamber;
a substrate support configured to support a substrate within the vacuum chamber; and
a sputtering gun, disposed within the vacuum chamber and oriented in relation to the substrate support such that, during operation of the sputtering gun, atoms of a target material are ejected toward the substrate for condensative dangling of the target material on the substrate, comprising:
a heat sink having magnets encased at least partially by a surface of the heat sink, wherein the heat sink is configured to form a ring groove on the surface of the heat sink encasing the magnets; and
a retainer ring configured to form a trapped magnetic field in operation and to support the heat sink and the target material for sputtering on the substrate such that:
the target material contacts the surface of the heatsink thereby forming an empty space between the ring groove on the surface of the heat sink and the target material; and
both the magnets and the ring groove on the surface of the heat sink are under the target material;
wherein the MTS system is configured such that during operation of the MTS system:
a portion of a magnetic field generated by the magnets is trapped within the ring groove creating a trapped magnetic field;

a direct current (DC) or radio frequency (RF) discharge plasma volume is deflected by the trapped magnetic field to position the plasma over the surface of the target material above the ring groove of the heat sink, whereby heating the surface of the target material is accelerated to cause the surface of the target material to change to a liquid phase; and the atoms of the target material are readily sputtered onto the substrate, the trapped magnetic field providing an additive force to push out the plain atoms and ionized atoms of the target material;

wherein the ring groove abuts the target material such that the empty space is in direct communication with the target material, the empty space being configured to be unfilled; and wherein the ring groove is configured to reduce heat flow and retain thermal energy to at least partially melt a surface of the target material.

6. The MTS system of claim 5, wherein:

during operation of the MTS system the substrate's temperature is at or below about 500° C.; and the substrate is composed of sapphire, the sputtering of the atoms of the target material onto the substrate being configured to grow a single crystal SiGe film on the substrate.

7. The MTS system of claim 5, wherein the sputtering gun is configured such that:

the magnets comprise a ring of magnets and a center magnet positioned within the ring of magnets; and the ring groove is formed in the surface of the heat sink between the ring of magnets and the center magnet.

8. The MTS system of claim 7, wherein the heat sink is a tubular water cooled copper heat sink.

9. The MTS system of claim 7, wherein a depth and a width of the ring groove are both a same value from about 1 mm to about 2 mm.

10. The MTS system of claim 9, wherein the plasma volume consists of one or more of argon and nitrogen.

11. The MTS system of claim 10, wherein the surface of the target material is changed to the liquid phase with the retained thermal energy by the ring groove only as a thermally insulating gap and without addition of an electron beam, an ion beam, or a high power pulse mode.

12. The MTS system of claim 11, wherein the plain atoms and ionized atoms removed from the target material are sputtered onto the substrate with a flux density at or above about 2 nanometers per second and a kinetic energy at or above about 5 electronvolts.

13. A Molten Target Sputtering (MTS) method, comprising:

heating a substrate within a vacuum chamber to a designated temperature;

providing a direct current (DC) or radio frequency (RF) discharge plasma volume to position and contact a surface of a target material supported by a retainer ring of a sputtering gun thereby heating the surface of the target material causing the surface of the target material to change to a liquid phase, wherein:

the sputtering gun comprises a heat sink having magnets encased at least partially by a surface of the heat sink and the heat sink is configured to form a ring groove on the surface of the heat sink encasing the magnets; and the target material is supported by the retainer ring such that:

the target material contacts the surface of the heat-sink thereby forming an empty space between the ring groove on the surface of the heat sink and the target material; and both the magnets and the ring groove on the surface of the heat sink are under the target material;

configuring the ring groove to abut the target material such that the empty space is in direct communication with the target material, keeping the empty space as unfilled;

preventing conductive dissipation of heat from the target material via the ring groove, thereby retaining thermal energy to increase a temperature of the target material;

trapping a portion of a magnetic field generated by the magnets within the ring groove to create a trapped free space magnetic field, wherein the trapped free space magnetic field keeps the DC or RF plasma volume positioned on the surface of target material directly opposite and above the ring groove; and sputtering atoms of the target material onto the substrate by ejecting the atoms of the target material toward the substrate to thereby cause condensative dangling of the target material on the substrate, the trapped magnetic field providing an additive force to push out the sputtered atoms from the target material.

14. The method of claim 13, wherein:

the designated temperature is at or below about 500° C.; and the substrate is composed of sapphire, the sputtering of the atoms of the target material onto the substrate being configured to grow a single crystal SiGe film on the substrate.

15. The method of claim 13, wherein the sputtering gun is configured such that:

the magnets comprise a ring of magnets and a center magnet positioned within the ring of magnets; and the ring groove is formed in the surface of the heat sink between the ring of magnets and the center magnet.

16. The method of claim 15, wherein:

the heat sink is a tubular water cooled copper heat sink; and a depth and a width of the ring groove are both a same value from about 1 mm to about 2 mm.

17. The method of claim 16, wherein the plasma volume consists of one or more of argon and nitrogen.

18. The method of claim 17, wherein the surface of the target material is changed to the liquid phase with the retained thermal energy by the ring groove only as a thermally insulating gap and without addition of an electron beam, an ion beam, or a high power pulse mode.

19. The method of claim 18, wherein:

the sputtering of the atoms of the target material onto the substrate grows a single crystal SiGe film on the substrate; and the substrate is comprised of sapphire.

20. The method of claim 19, wherein the atoms of the target material are sputtered onto the substrate with a flux density at or above about 2 nanometers per second and a kinetic energy at or above about 5 electronvolts.

21. The sputtering gun of claim 1, wherein:

the magnets are at least partially embedded within the heat sink.

22. The sputtering gun of claim 1, wherein:
the magnets are completely encased within the heat sink; and
the magnets having an outer surface that is completely contacted by the heat sink such that the magnets are completely embedded within the heat sink.

\* \* \* \* \*